(12) United States Patent
Wang et al.

(10) Patent No.: US 9,490,266 B2
(45) Date of Patent: Nov. 8, 2016

(54) ARRAY SUBSTRATE AND METHOD FOR PRODUCING THE SAME AND DISPLAY APPARATUS

(71) Applicants: BOE TECHNOLOGY GROUP CO., LTD., Beijing (CN); Chongqing BOE Optoelectronics Technolgy CO., Ltd., Chongqing (CN)

(72) Inventors: Wu Wang, Beijing (CN); Haijun Qiu, Beijing (CN); Fei Shang, Beijing (CN); Guolei Wang, Beijing (CN); Rui Wang, Beijing (CN)

(73) Assignees: BOE TECHNOLOGY GROUP CO., LTD., Beijing (CN); Chongqing BOE Optoelectronics Technology Co., Ltd., Chongqing (CN)

( * ) Notice: Subject to any disclaimer, the term of this patent is extended or adjusted under 35 U.S.C. 154(b) by 0 days.

(21) Appl. No.: 14/740,943

(22) Filed: Jun. 16, 2015

(65) Prior Publication Data

US 2016/0225794 A1 Aug. 4, 2016

(30) Foreign Application Priority Data

Feb. 3, 2015 (CN) .......................... 2015 1 0055567

(51) Int. Cl.
| | |
|---|---|
| H01L 27/00 | (2006.01) |
| H01L 29/00 | (2006.01) |
| H01L 27/12 | (2006.01) |
| H01L 29/786 | (2006.01) |
| H01L 29/66 | (2006.01) |
| H01L 27/15 | (2006.01) |

(52) U.S. Cl.
CPC ......... *H01L 27/1222* (2013.01); *H01L 27/127* (2013.01); *H01L 27/15* (2013.01); *H01L 29/66742* (2013.01); *H01L 29/78696* (2013.01)

(58) Field of Classification Search
CPC . H01L 27/1222; H01L 27/15; H01L 27/127; H01L 29/4175; H01L 29/417; H01L 29/78696; H01L 29/66742
See application file for complete search history.

(56) References Cited

U.S. PATENT DOCUMENTS

| | | | |
|---|---|---|---|
| 8,703,510 B2* | 4/2014 | Song ................. | H01L 27/1288 438/149 |
| 2012/0119232 A1* | 5/2012 | Song ................. | H01L 27/1288 257/88 |
| 2013/0001602 A1* | 1/2013 | Park ................... | H01L 51/5265 257/88 |

* cited by examiner

*Primary Examiner* — Nikolay Yushin
(74) *Attorney, Agent, or Firm* — Kinney & Lange, P.A.

(57) ABSTRACT

Embodiments of the present invention relate to the display field and provide an array substrate, a method for producing the same and a display apparatus, for reducing a via hole space without adding a step for patterning the gate insulation layer and thereby reducing product costs. The array substrate includes a gate metal layer, a gate insulation layer, a source and drain metal layer and a passivation layer, wherein the array substrate is provided with a via hole, which passes through the passivation layer, the source and drain metal layer and the gate insulation layer and at which a transparent conductive material is deposited for connecting the source and drain metal layer with the gate metal layer.

7 Claims, 4 Drawing Sheets

ARRAY SUBSTRATE AND METHOD FOR PRODUCING THE SAME AND DISPLAY APPARATUS

CROSS-REFERENCE TO RELATED APPLICATION

This application claims the benefit of Chinese Patent Application No. 201510055567.3 filed on Feb. 3, 2015 in the State Intellectual Property Office of China, the whole disclosure of which is incorporated herein by reference.

BACKGROUND OF THE INVENTION

1. Field of the Invention

The present disclosure relates to the display field, and in particular, relates to an array substrate, a method for producing the same and a display apparatus.

2. Description of the Related Art

Currently, in some narrow frame GOA (Gate On Array) products, in order to narrow the frame, a step for patterning a gate insulation layer is typically added to reduce space of a via hole after the gate insulation layer is deposited. Taking an HADS (High Aperture Advanced-Super Dimensional Switching) product as an example, its production process needs 7 patterning steps (7 masks). In particular, its production process may include:

depositing a gate metal layer on a substrate and patterning the gate metal layer to form a patterned gate metal layer; depositing a gate insulation layer and patterning it to form a via hole in the gate insulation layer; depositing an active layer and patterning it to form a patterned active layer; depositing a source and drain metal layer and patterning it to form a patterned source and drain metal layer; depositing a first transparent conductive layer (1 ITO) and patterning it to form a patterned first transparent conductive layer; depositing a passivation layer (PVX) and patterning it to form a via hole in the passivation layer; depositing a second transparent conductive layer (2 ITO) and patterning it to form a patterned second transparent conductive layer. The above patterning includes steps of photoresist coating, exposing, developing, etching, peeling off photoresist and the like.

Through the above steps, a gate insulation layer via hole through the gate insulation layer 12 (formed by patterning the gate insulation layer) shown in FIG. 1 is formed in a wiring region at an edge of the substrate, and a gate wiring formed from the source and drain metal layer 14 is connected with the gate metal layer 11 through the gate insulation layer via hole, and the passivation layer 16 is deposited as a protective layer over the gate insulation layer via hole.

SUMMARY OF THE INVENTION

An embodiment of the present invention provides an array substrate comprising a gate metal layer, a gate insulation layer, a source and drain metal layer and a passivation layer, wherein the array substrate is provided with a via hole, which passes through the passivation layer, the source and drain metal layer and the gate insulation layer and at which a transparent conductive material is deposited for connecting the source and drain metal layer with the gate metal layer.

An embodiment of the present invention provides a display apparatus, comprising an array substrate, the array substrate comprising a gate metal layer, a gate insulation layer, a source and drain metal layer and a passivation layer, wherein the array substrate is provided with a via hole, which passes through the passivation layer, the source and drain metal layer and the gate insulation layer and at which a transparent conductive material is deposited for connecting the source and drain metal layer with the gate metal layer.

An embodiment of the present invention provides a method for producing an array substrate, the method comprising: depositing a gate metal layer on a substrate and patterning the gate metal layer to form a patterned gate metal layer; depositing a gate insulation layer; depositing a source and drain metal layer and patterning it to form a pattern including the via hole in the source and drain metal layer; depositing a passivation layer; patterning the passivation layer and etching the passivation layer and the gate insulation layer at the via hole to form a pattern including the via hole passing through the passivation layer, the source and drain metal layer and the gate insulation layer; depositing a transparent conductive film and patterning it to form a patterned transparent conductive layer, the patterned transparent conductive layer including a transparent conductive material at the via hole, the transparent conductive material at the via hole being configured to connect the source and drain metal layer with the gate metal layer.

BRIEF DESCRIPTION OF THE DRAWINGS

The above and other features of the present invention will become more apparent by describing in detail exemplary embodiments thereof with reference to the accompanying drawings. The following drawings only show some embodiments of the present invention, instead of limiting the present invention. The skilled person in the art may obtain other drawings from the following drawings and the knowledge in the art.

FIG. 3(*e*) is total design view of the respective layers at the via hole;

DETAILED DESCRIPTION OF PREFERRED EMBODIMENTS OF THE INVENTION

Figure 1:
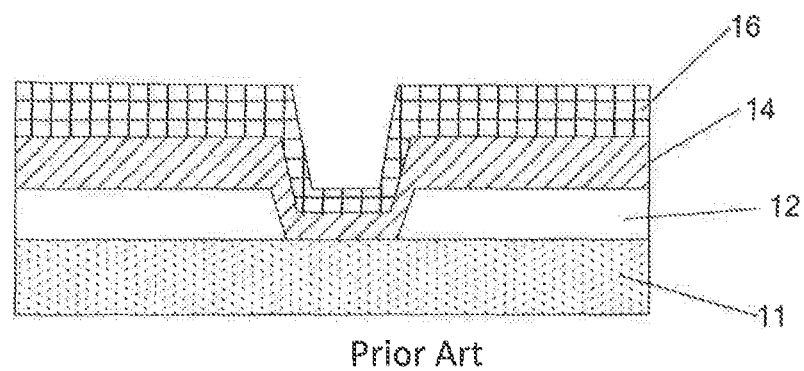
FIG. 1 schematically shows a cross-section of a wiring region at a via hole on a HADS array substrate in the prior arts.

Exemplary embodiments of the present disclosure will be described clearly in detail with reference to the attached drawings. The embodiments are only given by way of examples, instead of all of embodiments of the present invention.

According to a general concept of the present invention, there is provided an array substrate comprising a gate metal layer, a gate insulation layer, a source and drain metal layer and a passivation layer, wherein the array substrate is provided with a via hole, which passes through the passivation layer, the source and drain metal layer and the gate insulation layer and at which a transparent conductive material is deposited for connecting the source and drain metal layer with the gate metal layer.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 2:
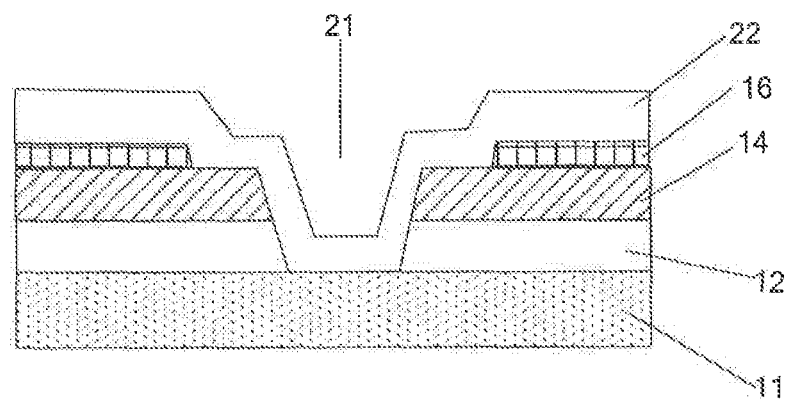
FIG. 2 schematically shows a cross-section of a wiring region at a via hole on a HADS array substrate according to an embodiment of the present invention.

As illustrated in FIG. 2, an embodiment of the present invention provides an array substrate. It includes a gate metal layer 11, a gate insulation layer 12 on the gate metal layer 11, a source and drain metal layer 14 and a passivation layer 16. The array substrate is provided with a via hole 21 which passes through the passivation layer 16, the source and drain metal layer 14 and the gate insulation layer 12. Transparent conductive material is deposited at the via hole 21, for connecting the source and drain metal layer 14 with the gate metal layer 11. In order to achieve a complete TFT arrangement, in an example, the array substrate further includes an active layer (distributed only in a display region, not shown).

In the embodiment, the via hole 21 passes through the gate insulation layer 12, the source and drain metal layer 14 and the passivation layer 16, and then the transparent conductive material 22 is deposited at the via hole 21 to connect the source and drain metal layer 14 with the gate metal layer 11. In comparison with the prior art shown in FIG. 1, such via hole design may allow to remove the gate insulation layer at the via hole when patterning other layers and thus omit the patterning step for the gate insulation layer 12, so as to reduce the costs of products.

Figure 3:
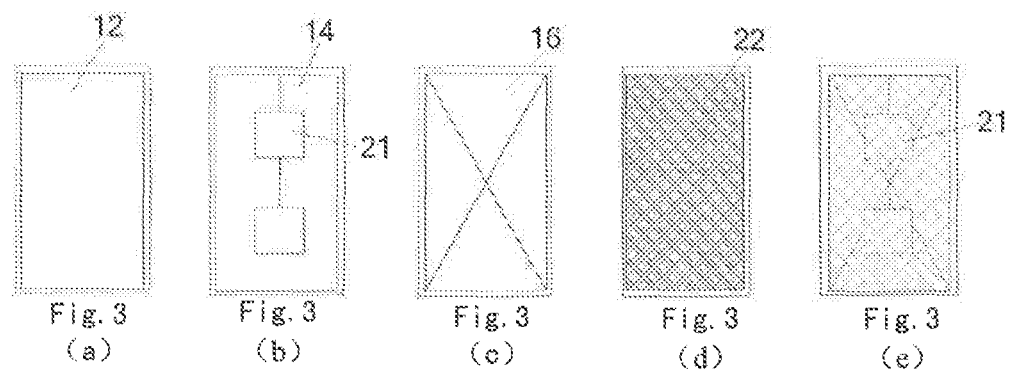
FIGS. 3(*a*)-3(*d*) are plan design views schematically showing respective layers where a gate insulation layer, a source and drain metal layer, a passivation layer and a transparent conductive layer are located, at the via hole.

The skilled person in the art would appreciate that, in the steps for patterning the respective layers, the formed pattern may further include other patterns beside the via hole 21. However, as the present disclosure is not directed to the other patterns, the following paragraphs only provide the explanations of forming via hole 21 and FIGS. 2-4 also only show the arrangement of the respective layers at the via hole 21. The embodiments will be explained in detail below with reference to the accompanied drawings.

In an example, the gate insulation layer 12 and the passivation layer 16 at the via hole 21 may be removed together when patterning the passivation layer, and the source and drain metal layer 14 at the via hole may be removed when patterning the source and drain metal layer. In particular, the via hole 21 may be formed by: depositing the gate insulation layer 12, depositing the source and drain metal layer 14 and patterning it to form a pattern including the via hole 21 in the source and drain metal layer 14, depositing the passivation layer 16, patterning the passivation layer 16 so as to etch off the passivation layer 16 and the gate insulation layer 12 at the via hole 21 to form a pattern including the via hole 21.

As an example, in order to provide the active layer, the active layer may be deposited directly and patterned after the gate insulation layer 12 is deposited and before the source and drain metal layer 14 is deposited (the active layer is only remained at a TFT, not shown in FIG. 2). In addition, in an example, the array substrate may further have other layers, and in this case, the process for producing these other layers may be completed before the passivation layer 16 is deposited.

In consideration characteristics of the used materials, the passivation layer 16 and the gate insulation layer 12 is typically dry etched to form patterns while the source and drain metal layer 14 is typically wet etched by etching liquid. In the embodiment, the pattern of the source and drain metal layer is redesigned such that the source and drain metal layer 14 at the via hole 21 is hollowed out when patterning the source and drain metal layer, and thus the passivation layer 16 and the gate insulation layer 12 at the via hole 21 can be removed together in the subsequent step of patterning the passivation layer.

FIGS. 3(a)-3(d) are plan design views schematically showing layers, at the via hole, where the gate insulation layer 12, the source and drain metal layer 14, the passivation layer 16 and the transparent conductive material 22 are located. FIG. 3(e) is total design view of the respective layers at the via hole. As illustrated in FIG. 3(a), the gate insulation layer 12 is not provided with a via hole pattern at a preset position thereof corresponding to the via hole 21, thus it is not required to pattern the gate insulation layer 12 after this layer is deposited in production, and the active layer may be directly produced. The source and drain metal layer 14 is provided with a via hole pattern at a preset position thereof corresponding to the via hole 21, as shown in FIG. 3(b), thus it needs to pattern the source and drain metal layer 14 after this layer is deposited to remove it at the position. Then, subsequent other layers may be produced according to the process described in the prior art (the other layers are not remained at positions corresponding to the via hole) until the deposition of the passivation layer 16 has been completed. As shown in FIG. 3(c), the passivation layer 16 is provided with a via hole pattern at a preset position thereof corresponding to the via hole and is patterned after being deposited, thus it needs to remove the passivation layer 16 and the gate insulation layer 12 together at positions corresponding to the via hole during the process. Finally, a layer of transparent conductive material is deposited to connect the source and drain metal layer 14 with the gate metal layer 11. In the embodiment, as an example, the via hole pattern of the passivation layer 16 is designed to be greater than the via hole pattern of the source and drain metal layer 14. In this way, as shown in FIG. 2, the transparent conductive material 22 may be deposited at the edge of the via hole in the source and drain metal layer 14. It facilitates to achieve a reliable connection between the gate metal layer 11 and the source and drain metal layer 14.

The array substrate provided by the embodiment of the present invention forms a via hole which passes through the passivation layer, the source and drain metal layer and the gate insulation layer, and the transparent conductive material configured to connect the source and drain metal layer with the gate metal layer is deposited at the via hole. This via hole design can reduce the via hole space to achieve a narrow frame without patterning the gate insulation layer in production, and thus the cost of the products may be reduced.

Figure 8:
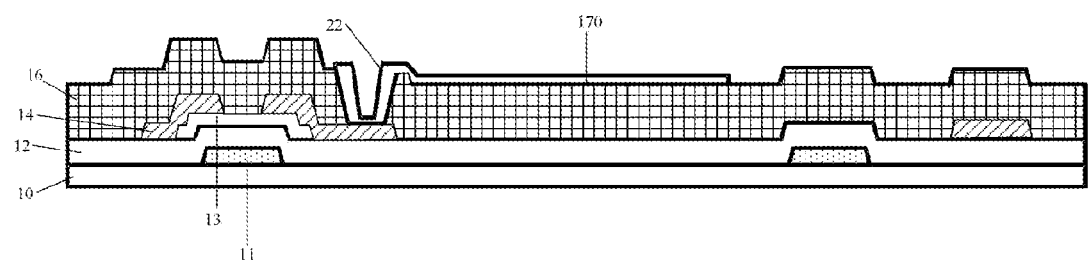
FIG. 8 is a schematic view showing a cross-section of a display region of an ADS array substrate.

With reference to FIG. 8, as an example, the array substrate may further include a pixel electrode 170. The transparent conductive material 22 at the via hole and the pixel electrode 170 are both formed in the same layer. In other examples, with reference to FIGS. 4 and 6, the array substrate may further include both a pixel electrode 170 and a common electrode 150. In this case, the transparent conductive material at the via hole 21 and the pixel electrode 170 are both formed by the same transparent conductive layer in the same patterning step, or the transparent conductive material at the via hole and the common electrode 150 are both formed by the same transparent conductive layer in the same patterning step. In this way, additional steps for forming the transparent conductive material 22 at the via hole 21 will not be needed.

As an example, for a TN (Twisted Nematic) type array substrate, with reference to FIG. 8, the array substrate is provided with only the pixel electrode 170 thereon. In this way, the transparent conductive material 22 at the via hole is typically formed in the same layer as the pixel electrode 170. That is, the transparent conductive material 22 and the pixel electrode 170 are both formed by the same transparent conductive layer. In contrast, for an array substrate in plane field mode such as an ADS (Advanced-Super Dimensional Switching) array substrate or HADS array substrate, with reference to FIGS. 4 and 6, the array substrate is not only provided with the pixel electrode 170, but also provided with the common electrode 150. In this way, the transparent conductive material 22 at the via hole may be formed in the same layer as the pixel electrode 170, or may be formed in the same layer as the common electrode 150. In practice, whether the transparent conductive material 22 at the via hole is formed in the same layer as the pixel electrode 170 or the common electrode 150 depends on which one of the pixel electrode 170 and the common electrode 150 may be arranged on the passivation layer, that is, which one of the pixel electrode 170 and the common electrode 150 may be formed after the passivation layer is formed.

With the via hole design in the embodiment, the step for patterning the gate insulation layer 12 may be omitted when the array substrate is produced so as to reduce the costs of products significantly.

In an example, the above array substrate may be produced by: depositing the gate metal layer on the substrate and patterning it to form a patterned gate metal layer; depositing the gate insulation layer; depositing the source and drain metal layer and patterning it to form a pattern including the via hole 21 in the source and drain metal layer; depositing the passivation layer; patterning the passivation layer and etching the passivation layer and the gate insulation layer at the via hole to form a pattern including the via hole which passes through the passivation layer, the source and drain metal layer and the gate insulation layer; depositing a transparent conductive film and patterning it to form a patterned transparent conductive layer, the patterned transparent conductive layer including a transparent conductive material at the via hole, the transparent conductive material at the via hole being configured to connect the source and drain metal layer with the gate metal layer.

As an example, in order to provide the active layer, the active layer may be deposited directly and patterned after the gate insulation layer 12 is deposited and before the source and drain metal layer 14 is deposited. In addition, in an example, the array substrate may further have other layers below the passivation layer 16, and in this case, the process for producing these other layers may be completed before the passivation layer 16 is deposited.

In an example, the step for forming the transparent conductive material 22 at the via hole and the step for forming the pixel electrode may be completed in the same step. That is, the patterned transparent conductive layer formed finally in the above process may further include the pixel electrode.

For an array substrate in a plane field mode, the step for forming the transparent conductive material 22 at the via hole and the step for forming the common electrode may be completed in the same step. In this way, the patterned transparent conductive layer may further include the common electrode. The process for producing the array substrate further includes a step for forming the pixel electrode. As an example, the transparent conductive material 22 at the via hole and the pixel electrode are formed in different layers respectively.

In order that the skilled person in the art can understand the structure of the array substrate and the method for producing the array substrate more apparently, the technical solutions of the present disclosure will be explained below in detail with reference to the specific embodiments.

The technical solutions of the embodiments may not only be used in an ADS (Advanced-Super Dimensional Switching) array substrate, but also be used in a horizontal field array substrate such as an HADS (High Aperture Advanced-Super Dimensional Switching) array substrate. It also may be used in a TN (Twisted Nematic) type array substrate.

Figure 4:
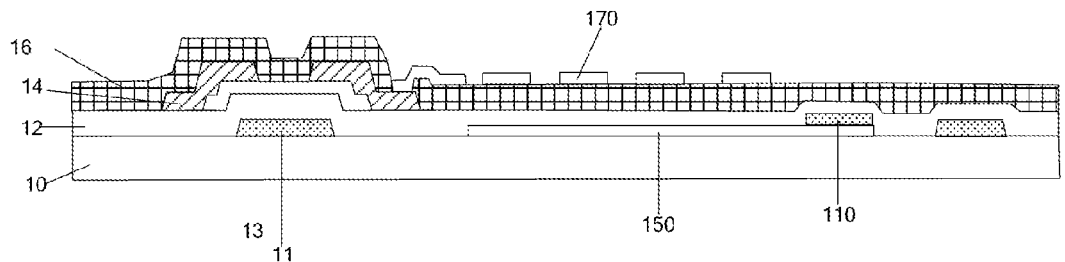
FIG. 4 is a schematic view showing a cross-section of a display region of an ADS array substrate.

For the ADS array substrate, as illustrated in FIG. 4, it includes: the common electrode 150, the gate metal layer 11, the gate insulation layer 12, the active layer 13, the source and drain metal layer 14, the passivation layer and the pixel electrode 170 formed on the substrate 10 in order from bottom to top. In the embodiment, the common electrode 150 is formed by a first transparent conductive layer before the gate metal layer 11 is formed, and arranged below the gate metal layer 11. A common electrode line 110 is arranged in the gate metal layer 11. The pixel electrode 170 is located on the passivation layer 16 and formed by a second transparent conductive layer.

In the embodiment, the transparent conductive material 22 at the via hole 21 and the pixel electrode 170 are formed by the same transparent conductive layer. That is, the second transparent conductive layer is patterned to form the pixel electrode 170 and the transparent conductive material 22 in the same step without adding extra steps for forming the transparent conductive material 22 at the via hole 21. Other structures at the via hole 21 are the same as those of the above embodiment, thus the detailed description thereof will be omitted.

Figure 5:
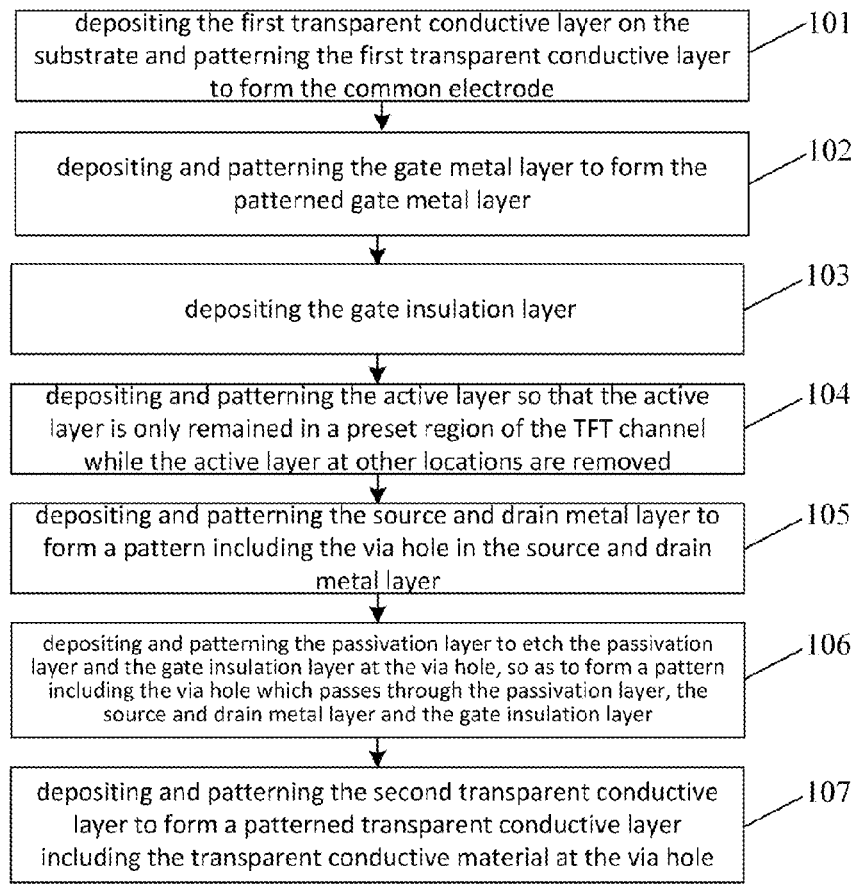
FIG. 5 is a flow chart of a method for producing an ADS array substrate provided by an embodiment of the present invention.

In an embodiment, the method for producing the ADS array substrate, as shown in FIG. 5, includes:

S101: depositing the first transparent conductive layer on the substrate and patterning the first transparent conductive layer to form the common electrode 150 as a plate electrode;

S102: depositing the gate metal layer 11 and patterning it to form the patterned gate metal layer, the patterned gate metal layer including patterns of a gate line, a TFT gate electrode and a common electrode line 110, the common electrode line 110 being parallel to the gate line and overlaid on the common electrode 150 (i.e., the first transparent conductive layer);

S103: depositing the gate insulation layer 12;

S104: depositing the active layer 13 and patterning it so that the active layer is only remained in a preset region of the TFT channel while the active layer at other locations are removed;

S105: depositing the source and drain metal layer 14 and patterning it to form a pattern including the via hole in the source and drain metal layer, the pattern in the source and drain metal layer 14 typically further including patterns of a source electrode, a drain electrode and a data line;

S106: depositing the passivation layer 16 and patterning it to etch the passivation layer 16 and the gate insulation layer 12 at the via hole, so as to form a pattern including the via hole 21 which passes through the passivation layer, the source and drain metal layer and the gate insulation layer, thereby the transparent conductive material 22 formed subsequently being connected to the gate metal layer 11 through the via hole 21, and in this step, a drain electrode via hole passing through the passivation layer 16 is also formed, and the pixel electrode 170 formed subsequently is connected to a drain electrode of the TFT through the drain electrode via hole;

S107: depositing the second transparent conductive layer and patterning it to form a patterned transparent conductive layer including the pixel electrode 170 which is a slit electrode, the patterned transparent conductive layer further including the transparent conductive material 22 at the via hole 21, the transparent conductive material 22 at the via hole 21 being configured to connect the source and drain metal layer 14 with the gate metal layer 11.

Further, in the array substrate according to the embodiment, the common electrode 150 may further be arranged below the pixel electrode 170 with the passivation layer 16 located between them. Correspondingly, the step S101 may be performed after the step S105 and before forming the passivation layer in the step S106.

The method for producing the ADS array substrate provided by the embodiment improves the existing process for producing the ADS array substrate. In the step of patterning the source and drain metal layer, the source and drain metal layer at the via hole 21 is removed. In the step of patterning the passivation layer, the passivation layer 16 and the gate insulation layer 12 at the via hole 21 are hollowed out together. In the step for producing the pixel electrode, the second transparent conductive layer is remained at the via hole so as to connect the gate metal layer with the source and drain metal layer, thereby meeting the requirement for design of narrow frame while omitting the step of patterning the gate insulation layer 2 so as to reduce the costs of products.

Figure 6:
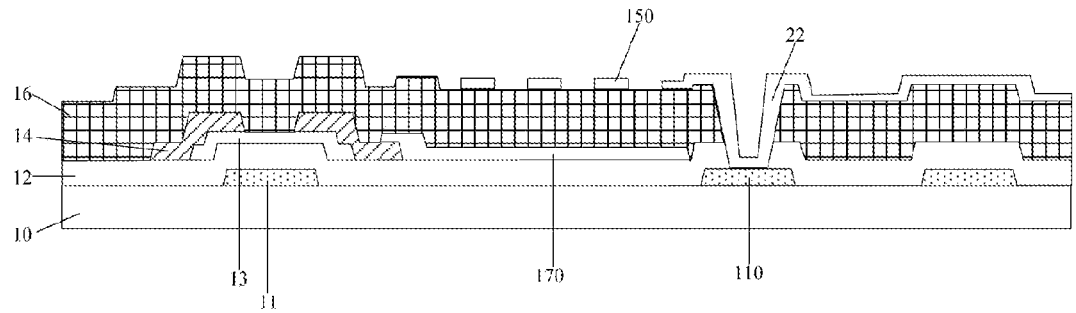
FIG. 6 is a schematic view showing a cross-section of a display region of a HADS array substrate.

If the array substrate in the embodiment is an HADS array substrate, as illustrated in FIG. 6, the array substrate will include: the gate metal layer 11, the gate insulation layer 12, the active layer 13, the source and drain metal layer 14, the pixel electrode 170, the passivation layer 16 and the common electrode 150 formed on the substrate 10 in order from bottom to top. In the embodiment, the pixel electrode 170 is formed by a first transparent conductive layer after the source and drain metal layer 14 is formed and before the passivation layer is formed, that is, the pixel electrode 170 is arranged below the common electrode 150 with the passivation layer 16 between them. The common electrode line 110 is arranged in the gate metal layer 11. The common electrode 150 is connected to the common electrode line 110 by the via hole which passes through the passivation layer 16 and the gate insulation layer 12. The pixel electrode 170 is located on the passivation layer 16 and formed by a second transparent conductive layer.

The structures at the via hole 21 are substantially the same as those in the previous embodiment except that the transparent conductive material 22 at the via hole 21 and the common electrode 150 are formed by the same transparent conductive layer. That is, the second transparent conductive layer is patterned to form the common electrode 150 and the transparent conductive material 22 at the via hole without adding extra steps for forming the transparent conductive material 22 at the via hole 21.

Figure 7:
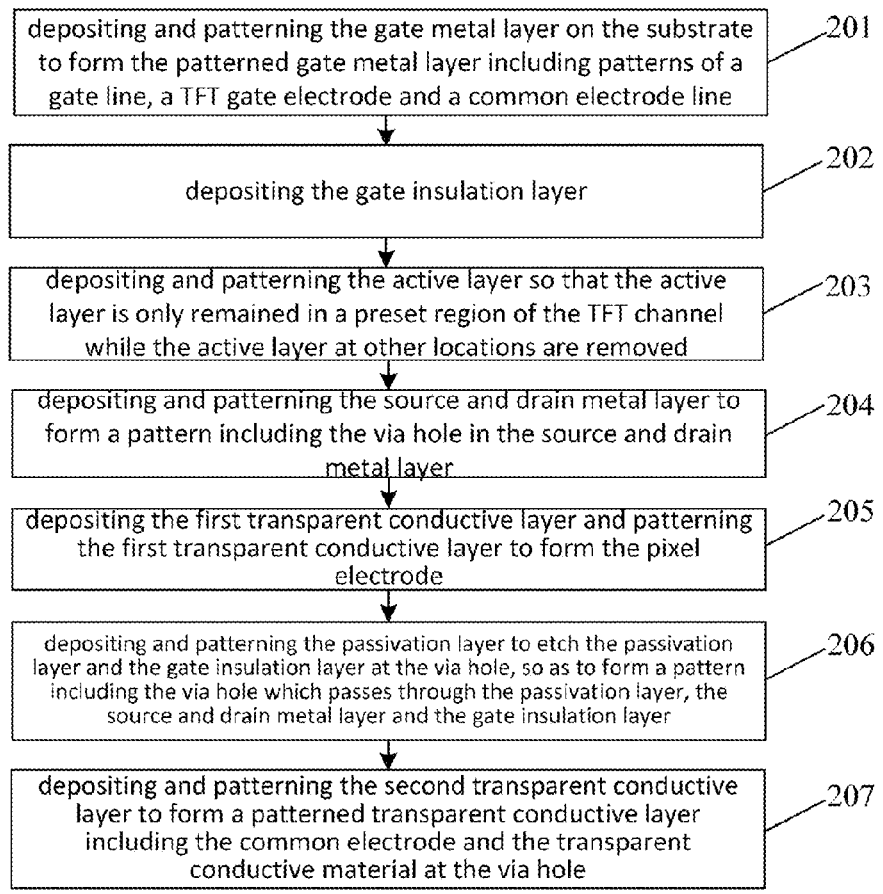
FIG. 7 is a flow chart of a method for producing an HADS array substrate provided by an embodiment of the present invention.

In an embodiment, the method for producing the ADS array substrate, as shown in FIG. 7, includes:

S201: depositing the gate metal layer on the substrate and patterning it to form the patterned gate metal layer, the patterned gate metal layer 11 including patterns of a gate line, a TFT gate electrode and a common electrode line 110, the common electrode line 110 being parallel to the gate line;

S202: depositing the gate insulation layer 12;

S203: depositing the active layer 13 and patterning it so that the active layer is only remained in a preset region of the TFT channel while the active layer is removed at other locations;

S204: depositing the source and drain metal layer 14 and patterning it to form a pattern including the via hole in the source and drain metal layer, the pattern in the source and drain metal layer 14 typically further including patterns of a source electrode and a drain electrode;

S205: depositing the first transparent conductive layer and patterning the first transparent conductive layer to form the pixel electrode 170 as a plate electrode;

S206: depositing the passivation layer 16 and patterning it to etch the passivation layer 16 and the gate insulation layer 12 at the via hole, so as to form a pattern including the via hole 21, which passes through the passivation layer, the source and drain metal layer and the gate insulation layer, and further including a via hole above the common electrode line 110;

S207: depositing the second transparent conductive layer and patterning it to form a patterned transparent conductive layer including the common electrode 150 which is a slit electrode, the patterned transparent conductive layer further including the transparent conductive material 22 at the via hole 21, the transparent conductive material 22 being configured to connect the source and drain metal layer 14 with the gate metal layer 11.

The method for producing the HADS array substrate provided by the embodiment improves the existing process for producing the HADS array substrate. In this way, not only the via hole may be formed to connect the gate metal layer with the source and drain metal layer to meet the requirement for design of narrow frame, but also the step of patterning the gate insulation layer 12 may be omitted so as to reduce the costs of products.

The array substrate in the embodiment may also be a TN type array substrate, as shown in FIG. 8, which includes: the gate metal layer 11, the gate insulation layer 12, the active layer 13, the source and drain metal layer 14, the passivation layer 16 and the pixel electrode 170 formed on the substrate 10 in order from bottom to top. The pixel electrode 170 is made of the transparent conductive layer after the passivation layer 16. The common electrode is located on a color filter substrate, which is not referred in the embodiment.

The method for producing the TN type array substrate provided by the embodiment is similar to the existing process for producing the TN type array substrate, but the source and drain metal layer at the via hole 21 is removed in the step for patterning the source and drain metal layer, the passiviation layer 16 and the gate insulation layer 12 at the via hole 21 are etched off together in the step for patterning the passivation layer, and in the step for producing the pixel electrode, the second transparent conductive layer is remained at the via hole 21 so as to connect the gate metal layer with the source and drain metal layer to meet the requirement for design of narrow frame while omitting the step of patterning the gate insulation layer 12 so as to reduce the costs of products.

An embodiment of the present invention also provides a display apparatus including an array substrate described in any one of the above embodiments. The display apparatus not only may achieve the design of narrow frame, but also may omit the step of patterning the gate insulation layer after depositing the gate insulation layer in production. The display apparatus may include any products or components having display function, such as a liquid panel, an electronic paper, a cell phone, a tablet computer, TV, a display, a notebook computer, a digital photo frame, a navigator or the like.

The array substrate and display apparatus provided by an embodiment of the present invention are formed with the via hole which passes through the passivation layer, the source and drain metal layer and the gate insulation layer, and the transparent conductive material connecting the source and drain metal layer with the gate metal layer may be deposited at the via hole. Such via hole design may reduce the via hole space to achieve the narrow frame without adding the step for patterning the gate insulation layer in production. Thus, it may reduce the costs of the products significantly. In an example, in the array substrate according to the embodiment of the present invention, the source and drain metal layer at via hole is removed by patterning the source and drain metal layer when a wiring via hole is formed in the gate metal layer; and then the passivation layer and the gate insulation layer are etched off at the via hole in the step for patterning the passivation layer, and the transparent conductive material is deposited in the via hole to connect the gate metal layer with the source and drain metal layer. In this way, it may form the via hole in which the transparent conductive material is deposited to connect the gate metal layer with the source and drain metal layer without adding the step for patterning the gate insulation layer.

For the sake of clarity, in the present disclosure, the terms such as "first", "second" are used to distinct similar items from each other. These terms are used by way of examples, instead of limiting the present invention in number of features. In accordance with the present disclosure, all of similar variants or associated extensions that are apparent to the skilled person in the art will fall within the scope of the present disclosure.

All of technical features in the embodiments may be used arbitrarily in combination unless they are in conflict.

All of embodiments in the present disclosure are explained clearly. Same or similar parts of these embodiments may be referred to each other. In the description for each embodiment, the distinctions from other embodiments are mainly discussed. In particular, in the description for the apparatus embodiments, the parts similar to the process embodiments are omitted as they have been explained in the description for the process embodiments.

Although several exemplary embodiments have been shown and described, the present invention is not limited to those and it would be appreciated by those skilled in the art that various changes or modifications may be made in these embodiments without departing from the principles and spirit of the disclosure, the scope of which is defined in the claims and their equivalents.

What is claimed is:

1. An array substrate comprising:
   a first metal layer forming a gate electrode,
   a gate insulation layer,
   a second metal layer forming source and drain electrodes,
   a passivation layer,
   a pixel electrode, and
   a common electrode,
   wherein the array substrate is provided with a via hole, which passes through the passivation layer, the second metal layer forming the source and drain electrodes and the gate insulation layer and at which transparent conductive material is deposited for connecting the second metal layer forming the source and drain electrodes with the first metal layer forming the gate electrode, and wherein the transparent conductive material at the via hole and the common electrode are both formed by the same transparent conductive layer.

2. The array substrate according to claim 1, wherein, the via hole which passes through the passivation layer, the second metal layer forming the source and drain electrodes and the gate insulation layer is formed by:
   depositing the gate insulation layer;
   depositing the second metal layer forming the source and drain electrodes and patterning it to form a pattern including the via hole in the second metal layer forming the source and drain electrodes;
   depositing the passivation layer;
   patterning the passivation layer and etching the passivation layer and the gate insulation layer at the via hole to form a pattern including the via hole.

3. A display apparatus, comprising: an array substrate, the array substrate comprising a first metal layer forming a gate electrode, a gate insulation layer, a second metal layer forming source and drain electrodes, a passivation layer, a pixel electrode and a common electrode, wherein the array substrate is provided with a via hole, which passes through the passivation layer, the second metal layer forming the source and drain electrodes and the gate insulation layer and at which a transparent conductive material is deposited for connecting the second metal layer forming the source and drain electrodes with the first metal layer forming the gate electrode, and wherein the transparent conductive material at the via hole and the common electrode are both formed by the same transparent conductive layer.

4. The display apparatus according to claim 3, wherein the via hole which passes through the passivation layer, the second metal layer forming the source and drain electrodes and the gate insulation layer is formed by:
   depositing the gate insulation layer;
   depositing the second metal layer forming the source and drain electrodes and patterning it to form a pattern including the via hole in the second metal layer for forming the source and drain electrodes;
   depositing the passivation layer;
   patterning the passivation layer and etching the passivation layer and the gate insulation layer at the via hole to form a pattern including the via hole.

5. A method for producing an array substrate, the method comprising:
   depositing a first metal layer forming a gate electrode on a substrate and patterning the first metal layer forming the gate electrode to form a patterned metal layer forming the gate electrode;
   depositing a gate insulation layer;
   depositing a second metal layer forming source and drain electrodes and patterning it to form a pattern including a via hole in the second metal layer forming the source and drain electrodes;
   depositing a passivation layer;
   patterning the passivation layer and etching the passivation layer and the gate insulation layer at the via hole to form a pattern including the via hole passing through the passivation layer, the second metal layer for forming the source and drain electrodes and the gate insulation layer; and
   depositing a transparent conductive film and patterning it to form a patterned transparent conductive layer, the patterned transparent conductive layer including a transparent conductive material at the via hole, the transparent conductive material at the via hole being configured to connect the second metal layer forming the source and drain electrodes with the first metal layer forming the gate electrode, wherein the patterned transparent conductive layer further comprises a common electrode and a pixel electrode, and a transparent conductive material at the via hole and the common electrode are formed at the same step.

6. The method according to claim 5, wherein the transparent conductive material at the via hole and the pixel electrode are formed in different layers respectively.

7. The method according to claim 5, further comprising:
depositing and patterning an active layer after depositing the gate insulation layer and before depositing the second metal layer forming the source and drain electrodes.

* * * * *